United States Patent [19]

Li et al.

[11] Patent Number: 5,441,815
[45] Date of Patent: Aug. 15, 1995

[54] PROCESS FOR PRODUCING EASILY REMOVABLE POLYIMIDE RESIN FILM

[75] Inventors: Chien-Hui Li; Syh-Ming Ho, both of Hsinchu, Taiwan

[73] Assignee: Industrial Technology Research Institute, China

[21] Appl. No.: 297,176

[22] Filed: Aug. 29, 1994

[51] Int. Cl.⁶ ............... B32B 15/08; B32B 15/20; B32B 27/34; B05D 7/16
[52] U.S. Cl. ................ 428/473.5; 428/458; 427/407.1; 427/409; 427/419.5; 427/419.8
[58] Field of Search ........... 427/380, 379, 409, 419.5, 427/156, 407.1, 419.8; 428/458, 473.5, 435

[56] References Cited

U.S. PATENT DOCUMENTS

| | | | |
|---|---|---|---|
| 4,426,253 | 1/1984 | Kreuz et al. | 156/668 |
| 4,431,479 | 2/1984 | Barbe et al. | 162/9 |
| 4,436,583 | 3/1984 | Saiki et al. | 156/659.1 |
| 4,522,880 | 6/1985 | Klostermeir et al. | 427/385.5 |
| 4,590,115 | 5/1986 | Cassat | 427/306 |
| 4,604,160 | 8/1986 | Murakami et al. | 156/233 |
| 4,848,929 | 7/1989 | Rawl | 383/85 |
| 4,863,808 | 9/1989 | Sallo | 428/601 |
| 4,876,153 | 10/1989 | Thorfinnson | 428/447 |
| 4,898,753 | 2/1990 | Inoue et al. | 427/379 |
| 5,004,627 | 4/1991 | Presswood et al. | 427/379 |
| 5,043,227 | 8/1991 | Perry et al. | 428/463 |
| 5,137,751 | 8/1992 | Burgess et al. | 427/379 |
| 5,248,760 | 9/1993 | DuBois et al. | 427/379 |
| 5,284,600 | 2/1994 | Hilti et al. | 252/518 |

*Primary Examiner*—Shrive Beck
*Assistant Examiner*—Diana Dudash
*Attorney, Agent, or Firm*—Banner & Allegretti, Ltd.

[57] ABSTRACT

It is disclosed a process for producing an easily removable polyimide film comprising the steps of:
(1) coating on a substrate a first layer of polyamic acid resin;
(2) coating on the first layer of polyamic acid resin a second layer of polyamic acid resin which is premixed with a salt of Cu, Cr, Ni or Fe, and
(3) baking the first layer and the second layer, whereby polyamic acid in both layers are cyclized to form a polyimide film.

Easily removable polyimide film prepared by the above process is also disclosed.

10 Claims, No Drawings

PROCESS FOR PRODUCING EASILY REMOVABLE POLYIMIDE RESIN FILM

BACKGROUND OF THE INVENTION

The subject invention relates to a process for producing easily removable polyimide resin film.

Polyimide resin exhibits excellent mechanical properties, electrical properties and chemical resistance and thus are widely used in multichip modules(MCM), flexible printed circuit (FPC) and tape automatic bonding-(TAB).

In the productions of MCM, FPC or TAB, especially multi-clad (multi-layer) boards, it is necessary to form small vias or holes through the clad and then a conductive bridge within the vias or holes to ensure conductive connection across different layers. In the formation of the so-called sprocket holes or device holes, the portion of polyimide film in the position of the hole must be removed.

However, due to its excellent chemical resistance, the etching of fully imidized polyimide is generally difficult. Here imidization means the reaction from the polyamic acid precursor to polyimide final product.

A dry etching process has been used which uses a laser beam to remove polyimide film. Although dry etching process can directly remove polyimide, the initial cost for installing dry etching equipment such as laser etching apparatus is relatively high and the etching rate is very slow.

The alternative of wet etching requires that the polyamic acid (precursor of polyimide) be first partially imidized before etching, followed by fully imidization to polyimide after etching. However, soft baking is required to remove the solvent in the wet etching process and photoresist is often required to selectively etch polyimide.

Among various wet etching methods, conventional chemical etching process for polyimide comprises the application of a photoresist followed by etching with an etching solution. The etching solutions less hazardous to the environment include those disclosed in U.S. Pat. Nos. 4,426,253(1984), 4,431,479(1984), 4,436,583(1984) and 4,848,929 (1989). However, species of polyimide materials which can be efficiently etched by those etching solutions are limited due to the low etching rate. For example, polyimides with trade name Kapton or its precursor with the trade name Pyralin is often used as disclosed in U.S. Pat. Nos. 4,436,583 and 4,848,929.

Furthermore, in the production of adhesive-free TAB, a layer of conductive metallic layer must be coated on a polyimide film. One process is to coat a thin layer of metal by sputtering such as the process of U.S. Pat. No. 4,863,808 in which a metallic film is sputtered on Kapton. However, the cost of this process is relatively high due to the need of the sputtering step.

Another approach for producing adhesive-free TAB is the low cost die-casting method in which a thin layer of polyimide is die-cast on a thin metallic film. However, die-cast TAB suffers from poor etching property and the adhesion and flatness are contradictory to each other. It is therefore very difficult to produce a TAB which has good adhesion and flatness at the same time and which can be easily etched.

Another approach for improving the etching efficiency of polyimide is the use of commercialized photosensitive or soluble polyimide material. However, such special material usually exhibit poorer mechanical properties, electrical properties and chemical resistance.

SUMMARY OF THE INVENTION

It is therefore an object of the subject invention to provide a process for producing a polyimde film which can be easily removed by conventional etching process or mechanical method with relatively low cost and high efficiency.

The present invention in its broadest context encompass a process for preparing an easily removable polyimide film comprising the steps of:

(1) coating on a substrate a first layer of polyamic acid resin;

(2) coating on the first layer of polyamic acid resin a second layer of polyamic acid resin which is premixed with a salt of a metal selected from the group consisting of Cu, Cr, Ni and Fe, and (3) baking the first layer and the second layer, whereby polyamic acid in both layers are cyclized to form a polyimide film.

DETAILED DESCRIPTION OF THE INVENTION

While this specification concludes with claims particularly pointing out and distinctly claiming that which is considered to be the invention, it is believed that the invention can be better understood from a reading of the following detailed description of the invention and the appended examples.

The substrate in the subject invention may be any substrate for any specific purpose and is customarily a conductive metal film such as a gold foil, silver foil and copper foil. The conductive metal film can be separately etched to form conductive pattern on the polyimide film for specific application.

Polyamic acid is the precursor for producing polyimide. The general formula for imidization reaction is as follows:

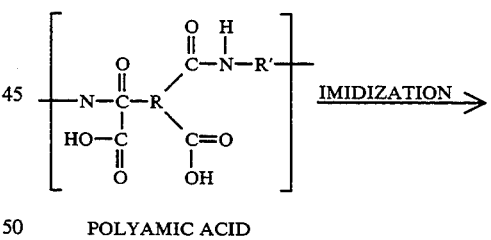

POLYAMIC ACID

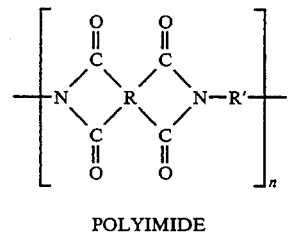

POLYIMIDE wherein R is an aromatic tetravalent organic radical and R' is a divalent radial of an aromatic or aliphatic diamine containing at least two carbon atoms, the two amino groups of the diamine each being attached to separate carbon atoms of the divalent radical.

Polyamic acids used in the first layer and the second layer may be the same or different from each other and may be produced by reacting a diamine with a dianhydride. The general formula for the reaction is as follows:

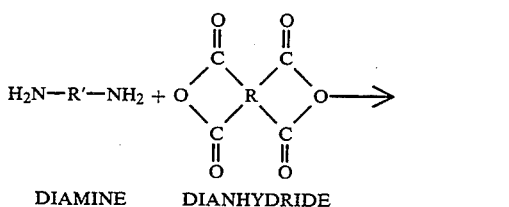

DIAMINE        DIANHYDRIDE

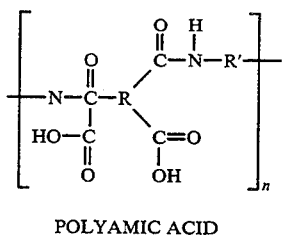

POLYAMIC ACID in which R and R' have the same meaning as stated above.

Typical dianhydrides are, for example, those disclosed in U.S. Pat. No. 3,853,813. Particularly preferred dianhydrides are bis-(3,4-dicarboxy phenyl)ether dianhydride (ODPA), 3,3'-4,4'-benzophenonetetracarboxylic dianhydride (BTDA) and 3,3'-4,4'-biphenyltetracarboxylic dianhydride (BPDA).

Typical diamines are, for example,
ethylene diamine,
propylene diamine,
tetramethylene diamine,
pentamethylene diamine,
hexamethylene diamine,
2-ethylhexylene diamine,
nonamethylene diamine,
decamethylene diamine,
2,11-diamino-dodecane,
meta-phenylene diamine,
para-phenylene diamine,
2,2'-naphthalene diamine,
4,4'-biphenylene diamine,
methylene dianiline-(4,4'-diaminodiphenyl methane),
methylene dianiline-(4,4'-diaminodiphenyl methane),
ethylene dianiline-(4,4'-diaminodiphenyl ethane),
propylene dianiline-(4,4'-diaminodiphenyl propane),
bis-(para-amino-cyclohexyl)N-phenyl amine,
bis-(para-amino-cyclohexyl)N-methyl amine,
hexafluoroisopropylidene-bis-(4-phenyl amine),
4,4'-diamino-diphenyl methane,
4,4'-diamino-diphenyl ethane,
4,4'-diamino-diphenyl propane,
4,4'-diamino-diphenyl butane,
2,6-diamino-pyridine,
bis-(4-amino-phenyl)diethyl silane,
bis-(4-amino-phenyl)diphenyl silane,
bis-(4-amino-phenyl)ethyl phosphine oxide,
bis-(4-amino-phenyl)phenyl phosphine oxide,
bis-(4-amino-phenyl)-N-phenylamine,
bis-(4-amino-phenyl)-N-methylamine,
3,3'-dimethyl-4,4'diamino-biphenyl,
3,3'-dimethoxy-benzidine
2,4-bis(b-amino-t-butyl)toluene,
bis-(para-b-amino-t-butyl-phenyl)ether.
para-bis-(2-methyl-4-amino-phenyl)benzene,
para-bis-(1,1 -dimethyl-5-amino-pentyl)benzene,
m-xylylene diamine,
p-xylylene diamine,
oxydianiline-(4,4'-diaminodiphenylether),
ketodianiline,
4,4'-diamino-diphenyl sulfide,
3,3'-diamino-diphenyl sulfide,
4,4'-diamino-diphenyl sulfone,
3,3'-diamino-diphenyl sulfone,
bis-(para-amino-cyclohexyl)methane,
bis-(para-amino-cyclohexyl)ethane,
bis-(para-amino-cyclohexyl)propane,
bis-(para-amino-cyclohexyl)sulfide,
bis-(para-amino-cyclohexyl)sulfone,
bis-(para-amino-cyclohexyl)ether,
bis-(para-amino-cyclohexyl)diethyl silane,
bis-(para-amino-cyclohexyl)diphenyl silane,
bis-(para-amino-cyclohexyl)ethyl phosphine oxide,
bis-(para-amino-cyclohexyl)phenyl phosphine oxide,
1,2-bis-(3-amino-propoxy)ethane
2,2-dimethyl propylene diamine,
3-methoxy-hexamethylene diamine,
2,5-dimethylheptamethylene diamine,
5-methylnonamethylene diamine,
1,4-diamino-cyclohexane,
1,2-diamino-octadecane, and
2,5-diamino-1,3,4-oxadiazole.

Particularly preferred diamines are 4,4'-diaminodiphenyl ether(4,4'-ODA), 3,3'-diamino diphenyl sulfone(3,3'-$SO_2$DA) and para-phenylene diamine(PDA).

Bismalimide (BMI) can be further added to further improve the adhesion.

Suitable solvents for reaction mixture include, for example, N-methyl-2-pyrollidone(NMP) and diethyleneglycol dimethyl ether(DEGDE).

The polyamic acid for the first layer may be the same as or different from the polyamic acid used in the second layer.

The metallic salt premixed in the second layer of polyamic acid are metallic salts of Cu, Cr, Ni or Fe. Preferred metallic salts in the subject invention are $CuCl_2.2H_2O$, $NiCl_2.2H_2O$ $FeSO_4$ and $CuSO_4$. The polyamic acid to metallic salt weight ratio is preferably from 0.05 to 20. Polyamic acid and metallic salts must be sufficiently mixed by, for example, mechanical agitation for 0.5 to 24 hours.

Baking of the first layer of polyamic acid and second layer of polyamic acid is required to cyclize polyamic acid, thereby polyimide is formed. Solvent should be remove before baking. Baking temperature is preferably from 100° to 400° C., more preferably from 100° to 200°.

The second layer of polyamic acid exhibits lower adhesion and is more susceptible to chemical etching after cyclilization as compared to the first layer of polyamic acid which is not added with a metallic salt. Consequently, the second layer can be more readily removed.

The polyimide thus formed can be easily removed by conventional chemical etching or mechanical method.

In the process of chemical etching, the substrate coated with the first layer and second and then baked is immersed in a chemical etching solution for 1 to 2 minutes and then immersed in de-ionized water for 20 to 50 seconds. The process is repeated to ensure the desired etching result. Conventional etching generally use for etching polyimide film may be used. For example, an etching solution comprising 6-35 wt % of KOH, 5-20wt % of H₂O and 55-89wt % of ethanol can be used. The temperature of the etching solution is preferably from 55° to 75° C. KOH may be replaced with NaOH. Ethanol may be replaced with polypropyl alcohol.

As will be shown by the following examples, the polyimide film produced according to the subject invention exhibits excellent adhesion to substrate and high etchability. The resultant polyimide film has otherwise the same properties as conventional polyimide films and thus high etchability can be realized without sacrificing other properties. Simple and efficient removal of polyimide film is thus made possible by the subject invention. For example, Expensive dry etching is not necessary using the subject invention. Conventional wet etching method requires that polyamic acid be first partially imidized before etching followed by full imidization, while the polyimide film according to the subject invention can by etched directly at fully imidized state. Photosensitive polyimide film and soluble polyimide films suffer from reduced total performance.

The advantages and improvements of the subject invention will be more evident from the following examples.

EXAMPLES

Preparation of polyamic acid varnish
Polyamic acid varnish 1:

3,3'-4,4'-biphenyltetracarboxylic dianhydride (BPDA), 3,3'-4,4'-benzophenonetetracarboxylic dianhydride (BTDA), para-phenylene diamine (PDA) and 4,4'-diaminodiphenyl ether (ODA) with a mole ratio of 1:1:1:1 were mixed and agitated for 4 hours under room temperature. BMI was added and the mixture was further agitated for 1 hour to obtain polyamic acid. Viscosity:5000-6000 cps. Polyamic acid content :15-16 wt %.

Polyamic acid varnish 2:

4,4'-diaminodiphenyl ether (4,4-ODA) 0.08 mole) bis-(3,4-dicarboxy phenyl)ether dianhydride (ODPA) 0.08 mole, diethyleneglycoldimethyl ether (DEGDE) 130 ml and N-methyl-2-pyrollidone (NMP) 70 ml were mixed and agitated for 6 hours under room temperature to obtain polyamic acid. Viscosity:450 cps.

Polyamic acid varnish 3:

3,3'-diamino diphenyl sulfone (3,3'-SO₂DA) 0.08 mole, bis-(3,4-dicarboxy phenyl)ether dianhydride (ODPA) 0.08 mole and diethyleneglycoldimethyl ether (DEGDE) 130 ml were mixed and agitated for 6 hours under room temperature Solution (I) of polyamic acid and metallic salts:

100 g of polyamic acid varnish 2 was added with 10 g of CuCl₂.2H₂O and agitated for 4 hours under room temperature.

Solution (II) of polyamic acid and metallic salt:

100 g of polyamic acid varnish 3 was added with 10 g of FeSO₄ and agitated for 4 hours under room temperature.

Experiments:

Adhesiveness to copper foil: tested according to I.P.C. No. 2.4.9.

Etching cycles: Film to be tested was immersed alternatively into an agitated solution of potassium hydroxide(13 wt % ), distilled water(11 wt % ) and ethanol(76wt %) at 60° C. for 1 minute and agitated deionized water at 60° C. for 30 seconds. One immersion in potassium hydroxide in ethanol solution and one immersion in deionized water solution is called one cycle. Cycles were repeated until the film was effectively etched. The ease of removing polyimide film was estimated by the number of etching cycles.

Example 1:

Polyamic acid varnish 1 was coated on a copper foil and then baked at 80° C. for 1 hour to give a polyimide film. The above solution (I) was then coated on the polyimide film by a doctor blade to a thickness of 360 mm, kept under room temperature for 10 minutes then 80° C. for 1 hour, and then placed in a vacuum oven to heat the film with the following temperature profile:- heating to 150° C. in 1 hour and keeping for 1 hour, heating to 250° C. in 1 hour and keeping for 1 hour, heating to 350° C. in 1 hour and keeping for 2 hours, then cooling to 150° C. in 2.5 hours. Imidization was thus completed. Experimental results: adhesiveness with copper foil: <0.3 lb/in, chemical corrosion etching cycles: 8.

Example 2:

The same procedures as example 1 except that solution (I) was substituted by solution (II). Experimental results: adhesiveness with copper foil: <0.3 lb/in, chemical corrosion etching cycles: 8.

Comparative Example A:

Polyamic acid varnish 1 was coated on a copper foil with a doctor blade to a thickness of 360 mm. The film was kept under 80° C. for 1 hour and then baked with the same conditions as example 1 to obtain imidized film. Experimental results: adhesiveness with copper foil: 7.8 lb/in, chemical corrosion etching cycles: >50.

While the invention has been described with respect to certain preferred exemplifications and embodiments, it is not intended to limit the scope of the invention thereby, but solely by the claims appended hereto.

We claim:

1. A process for producing an easily removable polyimide film comprising the steps of:
   (1) coating on a substrate a first layer of polyamic acid resin having no metallic salt;
   (2) coating on said first layer of polyamic acid resin a second layer of polyamic acid resin which is premixed with a salt of a metal selected from the group consisting of Cu, Cr, Ni and Fe, and
   (3) baking said first layer of polyamic acid and said second layer of polyamic acid, whereby polyamic acids in both layers are cyclized to form a polyimide film.

2. The process of claim 1, wherein said baking step is conducted under a temperature of from 100° to 400° C.

3. The process of claim 2, wherein said baking step is conducted under a temperature of from 100° to 200° C.

4. The process of claim 1, wherein said salt is selected from the group consisting of copper chloride, nickel chloride, ferrous sulfate, copper sulfate and any mixture thereof.

5. The process of claim 1, wherein said polyamic acid s a reaction product of a dianhydride and a diamine.

6. The process of claim 5, wherein said dianhydride s selected from the group consisting of bis-(3,4-dicarboxy phenyl)ether dianhydride, 3,3'-4,4'-benzophenonetetracarboxylic dianhydride and 3,3'-4,4'-biphenyltetracarboxylic dianhydride.

7. The process of claim 5, wherein said diamine is selected from the group consisting of 4,4'- diaminodiphenyl ether, 3,3'-diaminodiphenylsulfone and para-phenylene diamine.

8. The process of claim 1, wherein said substrate is a conductive metal foil.

9. The process of claim 8, wherein said substrate is a copper foil.

10. An easily removable polyimide resin film prepared by the process of claim 1.

* * * * *